(12) United States Patent
Chinosi et al.

(10) Patent No.: US 6,539,346 B1
(45) Date of Patent: Mar. 25, 2003

(54) METHOD FOR THE ELECTRIC DYNAMIC SIMULATION OF VLSI CIRCUITS

(75) Inventors: Mauro Chinosi, Agrate Brianza (IT); Carlo Guardiani, Mezzago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/370,514

(22) Filed: Aug. 6, 1999

(30) Foreign Application Priority Data

Sep. 9, 1998 (EP) ............................................ 98830526

(51) Int. Cl.⁷ .............................................. G06F 17/50
(52) U.S. Cl. ................................ 703/15; 703/16; 716/5
(58) Field of Search .............................. 703/14, 15, 16; 716/5

(56) References Cited

U.S. PATENT DOCUMENTS

| | | | | |
|---|---|---|---|---|
| 5,369,594 A | * | 11/1994 | Huang et al. | ................ 364/489 |
| 5,550,760 A | * | 8/1996 | Razdan et al. | ............... 364/578 |
| 5,553,008 A | * | 9/1996 | Huang et al. | ................ 364/578 |
| 5,694,579 A | * | 12/1997 | Razdan et al. | ................. 703/14 |
| 5,933,356 A | * | 8/1999 | Rostoker et al. | ............... 703/15 |
| 6,009,249 A | * | 12/1999 | Weber | ............................ 716/5 |
| 6,112,022 A | * | 8/2000 | Wei | ............................. 703/14 |
| 6,249,901 B1 | * | 6/2001 | Yuan et al. | ...................... 716/5 |

FOREIGN PATENT DOCUMENTS

EP    0 481 117 A1    10/1990

OTHER PUBLICATIONS

A Framework for Scheduling Multi–rate Circuit Simulation, Antony P–C Ng, 1989 ACM 0–89791–310–8/89/0006/0019.*

"Parallel mixed–Level Power Simulation" M. Chinosi, ACM 1–58113–109–7/99/06.*

Dragone et al., "Power Invariant Vector Compaction based on Bit Clustering and Temporal Partitioning", Proceedings, International Symposium on Low Power Electronics and Design (IEEE Cat. No. 98TH8379), Monterey, CA, USA, Aug. 10–12, 1998.

Frohlich et al., "A New Approach for Parallel Simulation of VLSI Circuits on a Transistor Level", IEEE Transactions on Circuits and Systems I: Fundamental Theory and Applications, Jun. 1998, IEEE, USA, vol. 45, No. 6, pp. 601–613.

* cited by examiner

*Primary Examiner*—Kevin J. Teska
*Assistant Examiner*—Fred Ferris
(74) *Attorney, Agent, or Firm*—Allen, Dyer, Doppelt Milbrath & Gilchrist, P.A.; Lisa K. Jorgenson

(57) ABSTRACT

A method for simulating an integrated circuit includes dividing the integrated circuit into a plurality of independent subcircuits using a digital simulator, electrically simulating each of the independent subcircuits for a simulation result, and linking together the simulation results. By splitting the simulation of the integrated circuit into a plurality of simulations of smaller independent subcircuits, the electrical simulation is faster and can be performed in parallel since each subcircuit is independent.

26 Claims, 2 Drawing Sheets

| CIRCUIT | GATES | CPU TIME KNOWN METHOD/INVENTION | MEMORY USE KNOWN METHOD/INVENTION | ERROR | NOTES |
|---|---|---|---|---|---|
| 9symml | 22 | 40,77s / 30,4s | 450K / 350K | +2,8% | COMBINATIONAL |
| Moore | 6 | 4,5s / 2,3s | 118K / 121K | +3% | SEQUENTIAL |
| mic2 | 1158 | 40m50s / 5m35s | 21,2M / 17,4M | -2% | COMBINATIONAL |
| adcenc | 240 | 5m6s / 3m40s | 16,3M / 13M | +5,2% | SEQUENTIAL |
| SPS3_32x16m4 | 352 | 5m3s / 4m50s | 12,5M / 5M | -4,2% | SELF-TIMED |
| MUX | 8 | 2s / 1,7s | 42K / 37K | -0,2% | COMBINATIONAL |
| m3s0066o_e | 89 | 20,4s / 12,2s | 17,7M / 800K | +1,3% | SEQUENTIAL |

Fig. 2

METHOD FOR THE ELECTRIC DYNAMIC SIMULATION OF VLSI CIRCUITS

FIELD OF THE INVENTION

The present invention relates to integrated circuits, and, more particularly, to a method for simulating an integrated circuit.

BACKGROUND OF THE INVENTION

A very large scale integrated (VLSI) circuit cannot be considered to be purely digital because of the presence of analog functions, customized blocks, memories, etc. If a highly accurate simulation is required for checking timing, power levels, etc., then an electrical simulator should be used. Since electrical simulators require a very long execution time and can be applied only to relatively small circuits, it is necessary to use alternative methods for simulating VLSI circuits.

Digital simulators, which are an alternative to electrical simulators, are fast, can handle large circuits and provide good modeling capabilities, but they cannot take into account an analog behavior of the circuit. In contrast, electrical simulators are slow, highly accurate, take any signal into account, but cannot handle large and complex circuits because of their low speed.

A simulation is a simplified representation of a known electrical circuit. An electrical circuit is modeled using elements which describe its function. The more accurate the descriptions, the closer the results are to the known electrical circuit. Simulation of VLSI circuits can be formed using devices and connections which represent the actual components used by designers, and the millions of parasitic components correlated to the physical implementation of the circuit on the silicon wafer.

These devices are stimulated by a testing rig which represents the action external the circuit. For any device, a group of model equations are solved to calculate or predict responses of the circuit to the stimuli generated by the testing rig. Since these equations might be very complex and must be solved in short times, the processing speed of the central processing unit (CPU) may be inadequate.

SUMMARY OF THE INVENTION

An object of the present invention is to provide a method for the electrical dynamic simulation of VLSI circuits which combines the advantages of an electrical simulator with those of a digital simulator.

Another object of the present invention is to provide a method for the electrical dynamic simulation of VLSI circuits capable of providing the results of the simulation in a short time.

Another object of the present invention is to provide a method for the electrical dynamic simulation of VLSI circuits which operates in a parallel manner on various hardware devices.

Yet another object of the present invention is to provide a method for the electrical dynamic simulation of VLSI circuits which allows a reduced amount of memory to record the results with respect to known methods.

Another object of the present invention is to provide a method for the electrical dynamic simulation of VLSI circuits which allows a reduction in the simulation load affecting the CPU.

Yet a further object of the present invention is to provide a method for the electrical dynamic simulation of VLSI circuits which is highly reliable, relatively easy to provide and at competitive costs.

These objects and others which will become apparent hereinafter are achieved by a method for the electrical dynamic simulation of VLSI circuits, characterized in that it includes using a digital simulator and starting from a circuit to be simulated, the step of determining a plurality of independent subcircuits whose dimensions are equal to, or smaller than, those of the circuit. The method further includes the steps of electrically simulating each one of the subcircuits, and linking together the results obtained by the electrical simulations of the subcircuits.

BRIEF DESCRIPTION OF THE DRAWINGS

Further characteristics and advantages of the invention will become apparent from the description of a preferred embodiment of the method according to the invention, illustrated only by way of a non-limitative example in the accompanying drawings, wherein:

FIG. 2 is a table listing results from a plurality of different circuits obtained by applying the method according to the present invention and by applying a known method.

DETAILED DESCRIPTION OF THE PREFERRED EMBODIMENTS

Figure 1:
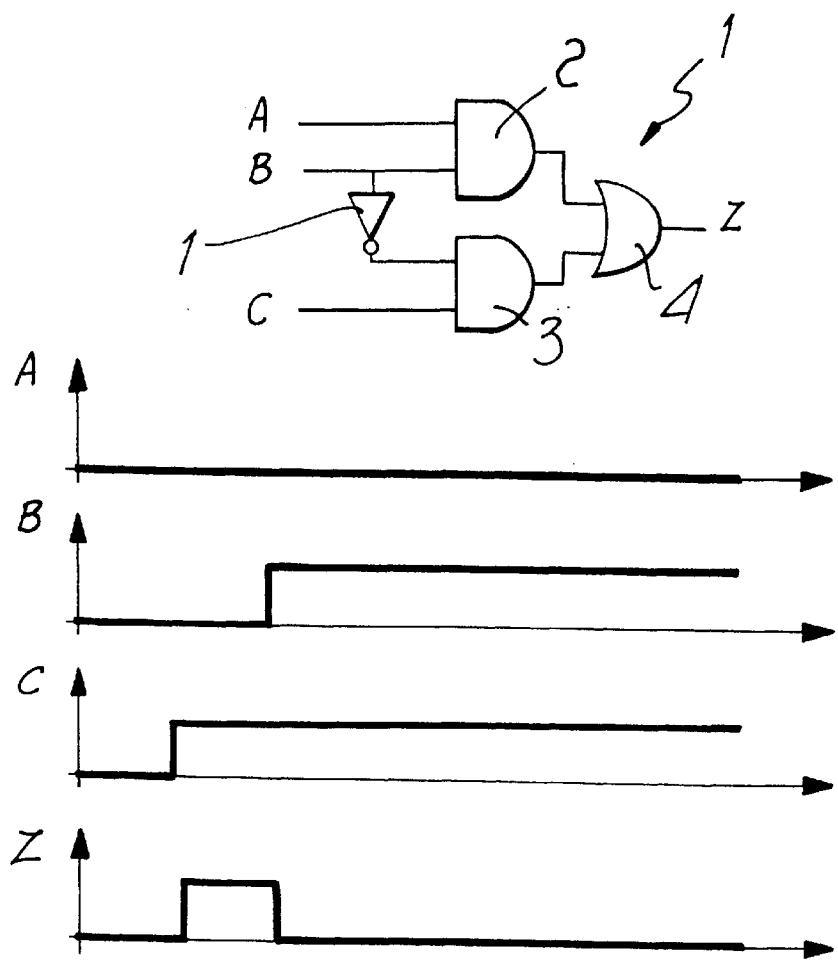
FIG. 1 is an example of the identification of the active dynamic devices from an electronic circuit, according to the present invention.
Figure 1:
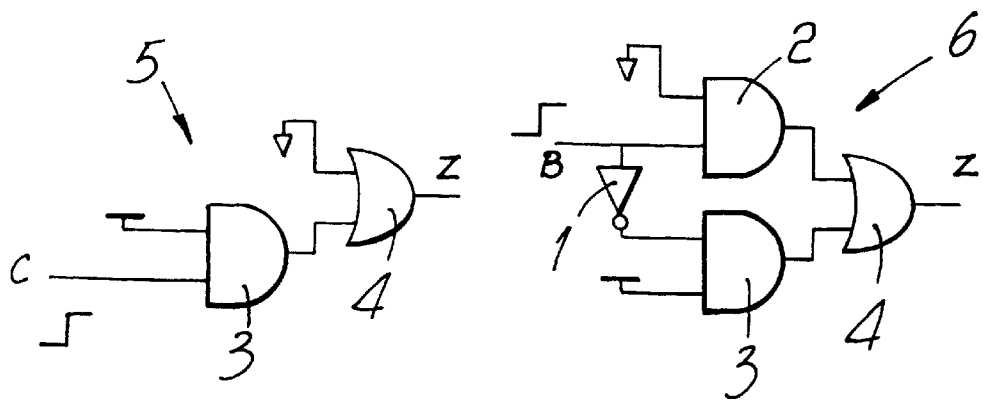

With reference to the above figures, the method according to the present invention starts by considering that in real applications not all devices are active at the same time. The larger the circuit, the higher the likelihood that there are inactive devices at a given moment. The presence of latency is a key factor to be used to reduce the processing time of the CPU of the hardware device used for the simulation.

The circuit to be modeled is therefore considered a dynamic combination of devices which are activated by the stimuli at the primary input of the circuit. At any given instant, the active circuit is formed by the group of devices excited by the stimuli or by the response of other devices excited earlier by the stimuli.

The remainder of the devices of the circuit that are not involved do not change state and might therefore be ignored. This is with respect to a functional point of view for modeling that occurs in a differential analysis. In this manner, it is possible to conveniently reduce the size of the circuit to be simulated and also provide parallelization. Accordingly, the simulation must be limited exclusively to the devices whose state changes, and the simulations are performed in parallel according to given criteria.

The method according to the invention provides for the determination of the active devices, i.e., the devices for which a digital transition is detected. As previously mentioned, if a device is digitally inactive and does not influence other devices, it could be removed from the list of active devices since its nodes do not change their value or state. The result does not change if the value of the nodes are assigned to the driven devices, and if an appropriate capacitive load replaces the devices and is connected to the device that sends the driving signals.

A device is defined as a group of single elements, e.g., MOSFETs, capacitors, etc., enclosed in a block whose input/output gates are known. A device is also considered active if a digital transition is detected at any one of its gates. By reference to the above definitions, a known digital simulator can detect changes of any order of a circuit and can also digitally log the value of all the nodes. An interface can be used to access the internal database of the digital simulator and identify or determine any type of information related to the nodes. Accordingly, the circuit is reduced to a plurality of subcircuits or subnetworks in which the devices are included if at least one of their gates is connected to another device whose value has changed.

All the gates are then processed. If it is a simulated network, all the gates are connected to the network. If there are no simulated inputs, then all the gates are connected to ground or to the supply voltage. If there are no simulated inputs or outputs, then all the gates are connected to the corresponding network and initialized.

The generated subnetworks are a subset of the entire set of devices of the circuit and are composed of the devices that are connected to simulated networks in a given time interval. An example of an initial complete circuit and its subnetworks for a basic simulation is given in FIG. 1. The reference numeral 1 designates the initial circuit having inputs A, B, C and an output Z.

The example circuit is composed of a set of logic gates, and specifically an inverter 1, two AND gates 2 and 3, and an OR gate 4. The signals A, B, C and Z are shown in the charts of FIG. 1 and yield the subnetworks designated by the reference numerals 5 and 6. These subnetworks represent the active devices according to the instant considered in relation to the application of the signals A, B and C. The subnetwork 5 is a schematic representation of the circuit 1 at the instant in which the signals A and B are zero and signal C has a step transition.

In this case, the inverter 1 is not present since its input is zero. Since a high signal would have been output by the inverter 1 with a low signal B as input, the second input of the AND gate 3, in addition to the input C, is connected to the supply voltage. The input of the OR gate 4 which is the output of the AND gate 2 is connected to ground since a low output signal would be present on the AND gate 2.

The second subnetwork, designated by the reference numeral 6, is the circuit obtained when the signal B performs a transition from low to high while the signal C is still high. In this case, therefore, the inverter 1 is included in the subcircuit. Since the signal does not perform a transition but remains high, as in the situation occurring in the circuit 5, the input of the AND gate 3 that corresponds to the signal C is at the supply voltage.

Therefore, on the basis of the timing chart of the signals A, B and C, the circuit 1 is divided into the two subcircuits 5 and 6 which include only the devices that are active at that given instant. The following information and other data can be processed: finding all simulated subcircuits; finding all subcircuits connected to a module; and finding the state or node value of a subcircuit.

A combination of the above information leads to the determination or identification of the devices that are active at every instant according to the different timing signals. It is also possible to determine the state of the subcircuits that are not simulated. In general, devices are included in the subcircuit that must be simulated electrically if at least one of their gates is connected to a subcircuit whose value has changed.

The dynamic time-dependent partitioning of the circuit is provided according to different methods. One method is a fixed time interval or a time interval defined between the time elapsed between transitions of signals arriving from the testing rig and input to the circuit. Another method, for example, uses a ratio between active devices and all devices.

The advantage of using the signal or signals arriving from the testing rig is that the slope of the signal is known. Therefore, a time interval considered to determine the active devices occurs at an input transition of the signal. The subcircuits are thus formed exclusively of the active circuits. The subcircuits are formed starting from the circuit to be simulated.

Therefore, whenever a subcircuit composed of a plurality of active devices is determined, it is possible to perform an independent simulation for each subcircuit. Therefore, it is possible to perform them in parallel on different hardware devices. The results are valid only with regards to the time interval to which the current subcircuit relates.

Although the active devices change dynamically from one time interval to the next, the state of the input/output ports of the devices are known as a result of the digital simulator. This allows compatibility of the internal state even if one or more input nodes of the current device are not connected to any driving device.

If the device has an internal node which maintains a memory-type behavior, such as a flip-flop circuit, the nodes must become visible external the device. For example, they might be handled as extended floating outputs, i.e., with a non-connected output pin. All the output nodes, including the latter, can be initialized to obtain a faster convergence for the DC operating point. The internal nodes are resolved automatically by the simulator during the evaluation of the DC operating point. Floating nodes cannot be accessed by the digital simulator. The electrical simulator provides an estimation on the basis of its internal hysteresis.

With regards to data collections, the individual results can be linked together to form the entire simulation. Simulating then entails identifying and extracting the active devices, i.e., the devices for which a digital transition has been detected. The simulation also includes the step of evaluating the voltage that is present on the inactive nodes of the circuit, and estimating the equivalent loads for replacing the nodes.

FIG. 2 is a table which compares various circuits listed in the first column formed by the number of gates listed in the second column. A third column indicates the operating time of the CPU. This column compares the simulation of the full circuit and the simulation performed by the method according to the invention.

The fourth column of the table lists the memory contents of modeling performed by known methods in comparison with modeling performed by the method according to the invention. The fifth column lists a percentage error for the calculated average power level of the simulated circuit. The last column lists the type of circuit which can be combinational, sequential or self-timed.

The method according to the invention achieves the intended objects since it allows for splitting the simulation of a large circuit into a plurality of simulations of smaller independent subcircuits, each of which can be simulated electrically. In this manner, the electrical simulation is faster and can also be performed in parallel since each circuit is independent of the other. The method is susceptible to numerous modifications and variations, all of which are within the scope of the invention. All the details may furthermore be replaced with other technically equivalent elements.

That which is claimed is:

1. A method for simulating an integrated circuit comprising a plurality of devices, the method comprising:

dividing the integrated circuit into a plurality of independent subcircuits using a digital simulator, the dividing comprising
defining a plurality of time intervals,
identifying each device having a digital transmission during each time interval,
evaluating a voltage present on inactive nodes of the integrated circuit, and
estimating equivalent loads for replacing the inactive nodes for each time interval;
electrically simulating each one of the independent subcircuits for providing a simulation result; and
linking together the simulation results.

2. A method according to claim 1, wherein the simulating is performed using an electrical simulator.

3. A method according to claim 1, wherein using the digital simulator comprises using an interface to access an internal database of the digital simulator for accessing information on nodes of the integrated circuit.

4. A method according to claim 1, wherein each device comprises at least one transistor having a gate; and wherein each device having a digital transmission during a time interval is an active device if at least one gate connected to a node of the integrated circuit has a changed value.

5. A method according to claim 4, further comprising connecting respective inputs of an active device to a supply voltage if the time interval has a signal that is normally present at the input is a first value, and connecting respective inputs of the active device to ground if the signal that is normally present at the input is a second value.

6. A method according to claim 1, wherein defining each time interval comprises determining a time elapsed between two transitions of input signals applied to an input of the integrated circuit.

7. A method according to claim 1, wherein defining each time interval comprises selecting a fixed time interval.

8. A method according to claim 1, wherein defining each time interval comprises determining a ratio between active devices and total devices.

9. A method according to claim 1, wherein defining each time interval comprises determining a time interval based on statistics obtained from other preceding simulations.

10. A method according to claim 1, wherein the integrated circuit comprises a very large scale integrated circuit (VLSI).

11. A method for simulating an integrated circuit comprising:
dividing the integrated circuit into a plurality of independent subcircuits using a digital simulator, the integrated circuit comprising a plurality of devices, the dividing comprising
defining a plurality of time intervals,
identifying each device having a digital transmission during each time interval,
evaluating a voltage present on inactive nodes of the integrated circuit, and
estimating equivalent loads for replacing the inactive nodes for each time interval;
simulating each one of the independent subcircuits for providing a simulation result; and
linking together the simulation results.

12. A method according to claim 11, wherein using the digital simulator comprises using an interface to access an internal database of the digital simulator for accessing information on nodes of the integrated circuit.

13. A method according to claim 11, wherein the simulating is performed using an electrical simulator.

14. A method according to claim 11, wherein each device comprises at least one transistor having a gate; and wherein each device having a digital transmission during a time interval is an active device if at least one gate connected to a node of the integrated circuit has a changed value.

15. A method according to claim 14, further comprising connecting respective inputs of an active device to a supply voltage if the time interval has a signal that is normally present at the input is a first value, and connecting respective inputs of the active device to ground if the signal that is normally present at the input is a second value.

16. A method according to claim 11, wherein defining each time interval comprises determining a time elapsed between two transitions of input signals applied to an input of the integrated circuit.

17. A method according to claim 11, wherein defining each time interval comprises selecting a fixed time interval.

18. A method according to claim 11, wherein defining each time interval comprises determining a ratio between active devices and total devices.

19. A method according to claim 11, wherein defining each time interval comprises determining a time interval based on statistics obtained from other preceding simulations.

20. A method according to claim 11, wherein the integrated circuit comprises a very large scale integrated circuit (VLSI).

21. A simulator system for an integrated circuit comprising a plurality of devices, the simulator system comprising:
a digital simulator dividing the integrated circuit into a plurality of independent subcircuits, said digital simulator being programmed for
defining a plurality of time intervals,
identifying each device having a digital transmission during each time interval,
evaluating a voltage present on inactive nodes, and
estimating equivalent loads for replacing the inactive nodes for each time interval; and
an electrical simulator simulating each one of the independent subcircuits for providing a simulation result, with the simulation results being linked together.

22. A simulator system according to claim 21, wherein said digital simulator comprises an internal database for storing information on nodes of the integrated circuit; and an interface for accessing the information.

23. A simulator system according to claim 21, wherein said digital simulator is further programmed for defining each time interval elapsed between two transitions of input signals applied to an input of the integrated circuit.

24. A simulator system according to claim 21, wherein said digital simulator is further programmed for selecting a fixed interval between two transitions of input signals applied to an input of the integrated circuit.

25. A simulator system according to claim 21, wherein said digital simulator is further programmed for determining a ratio between active devices and total devices.

26. A simulator system according to claim 21, wherein said digital simulator is further programmed for defining each time interval based on statistics obtained from other preceding simulations.

* * * * *